United States Patent
Cheng et al.

(10) Patent No.: US 8,916,943 B2
(45) Date of Patent: Dec. 23, 2014

(54) MEMS DEVICES HAVING A PLURALITY OF CAVITIES

(71) Applicant: Taiwan Semiconductor Manufacturing Company, Ltd., Hsin-Chu (TW)

(72) Inventors: Shyh-Wei Cheng, Zhudong Township, Hsinchu County (TW); Jui-Chun Weng, Taipei (TW); Hsi-Cheng Hsu, Taichung (TW); Chih-Yu Wang, Taichung (TW); Jung-Kuo Tu, Hsinchu (TW); Che-Jung Chu, Hsinchu (TW); Yu-Ting Hsu, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/782,051

(22) Filed: Mar. 1, 2013

(65) Prior Publication Data

US 2014/0246708 A1    Sep. 4, 2014

(51) Int. Cl.
  *H01L 29/84*    (2006.01)
  *B81B 7/00*    (2006.01)
  *B81C 1/00*    (2006.01)

(52) U.S. Cl.
  CPC ........... *B81B 7/0041* (2013.01); *B81C 1/00293* (2013.01)
  USPC .................. 257/415; 257/E29.324; 257/414; 257/417; 257/254; 257/420; 438/50; 438/53; 438/48; 438/700

(58) Field of Classification Search
  CPC .................. H01L 2924/1461; H01L 29/0657; H01L 21/50; H01L 29/84; B81C 1/00293; B81B 2201/025; B81B 7/02; B81B 2201/0264; B81B 2207/015; B81B 2201/0242; B81B 2203/0127; B81B 7/008
  USPC .......... 257/415, E29.324, 414, 417, 254, 420; 438/50, 53, 48, 700
  See application file for complete search history.

(56) References Cited

U.S. PATENT DOCUMENTS 8,350,346 B1 *    1/2013    Huang et al. .................. 257/415

OTHER PUBLICATIONS

Shyh-Wei Cheng et al., U.S. Appl. No. 13/353,059, filed Jan. 18, 2012, for "Motion Sensor Device and Methods for Forming the Same," 17 pages of text, 3 pages of drawings.

* cited by examiner

*Primary Examiner* — Eva Y Montalvo
(74) *Attorney, Agent, or Firm* — Haynes and Boone, LLP

(57) ABSTRACT

An integrated circuit device includes a first layer comprising at least two partial cavities, an intermediate layer bonded to the first layer, the intermediate layer formed to support at least two Micro-electromechanical System (MEMS) devices, and a second layer bonded to the intermediate layer, the second layer comprising at least two partial cavities to complete the at least two partial cavities of the first layer through the intermediate layer to form at least two sealed full cavities. The at least two full cavities have different pressures within.

19 Claims, 6 Drawing Sheets

MEMS DEVICES HAVING A PLURALITY OF CAVITIES

BACKGROUND

A micro-electromechanical system (MEMS) device is a piece of technology with components on a very small scale. MEMS devices may have components within the micrometer size range and sometimes within the nanometer size range. A typical MEMS device may include processing circuitry as well as mechanical components for various types of sensors. These sensors may be used as part of a gyroscope, accelerometer, or all kinds of motion sensors. Different MEMS devices are designed and fabricated to operate in different environments. For example, some types of MEMS devices are designed to operate in a vacuum while other MEMS devices are designed to operate within a pressurized environment. Due to these differences, MEMS devices are often manufactured separately and then combined into a single circuit that utilizes each of the different MEMS devices. Doing so, however, adds time and costs to the fabrication process. It is desirable to reduce the cost and simply the process of manufacturing an integrated circuit that includes MEMS devices within different operating environments.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
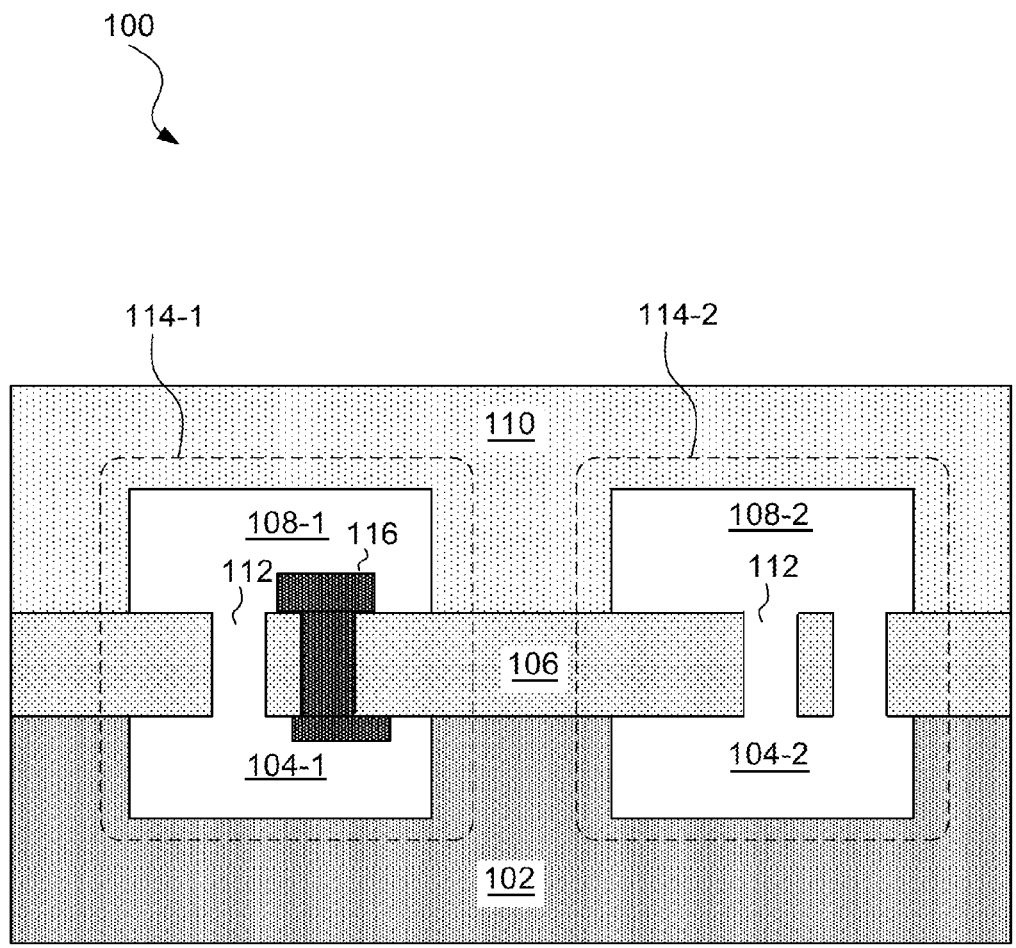
FIG. 1 is a diagram showing an illustrative integrated circuit having varied pressure operating environments, according to one example of principles described herein.

FIG. 1 is a diagram showing a cross-section view of an illustrative integrated circuit 100 with varied pressure operating environments 114, labeled in the figure as environments 114-1 and 114-2. These operating environments may be used to support various types of MEMS devices. In this example, the integrated circuit 100 includes two operating environments 114 that can be used to support MEMS devices 116. These MEMS devices 116 may include, for example, sensors that form a gyroscope, accelerometer, or motion sensor. According to certain illustrative examples, the integrated circuit 100 includes a first layer 102, an intermediate layer 106, and a second layer 110.

The first layer 102 may be made of a semiconductor material and may be in the form of a wafer. The semiconductor wafer can have various circuitry fabricated thereon. The circuitry can be designed to operate cooperatively with the MEMS devices 116 that are to be placed within the operating environments 114. In one example, the first layer is a Complementary Metal-Oxide Semiconductor (CMOS) layer.

To form the operating environments 114, recesses 104 are formed into the first layer 102. Specifically, the first recess 104-1 is formed for the first operating environment 114-1 and the second recess 104-2 is formed for the second operating environment 114-2. The first layer 102 is bonded to the intermediate layer 106.

The intermediate layer 106 may also be made of a semiconductor material. In some examples, the intermediate layer 106 may be made of other types of materials. The intermediate layer 106 may be bonded to the first layer 102 through use of a variety of methods. For example, as described in further detail below, the first layer 102 may be connected to the intermediate layer 106 through eutectic bonding.

The second layer 110 may also be made of a semiconductor material in the form of a wafer. The second layer 110 may be the main layer on which MEMS devices are formed and may thus be referred to as the MEMS layer. The second layer 110 also includes recesses 108 that are used to form the operating environments 114. Specifically, a first recess 108-1 is formed for the first operating environment 114-1 and corresponds to the first recess 104-1 of the first layer 102. Likewise, a second recess 108-2 is formed for the second operating environment 114-2 and corresponds to the second recess 104-2 of the first layer 102. The recesses 108 of the second layer 110 are designed to be complementary to the recesses 104 of the first layer 102. Specifically, the different recesses 104, 108 are designed to connect to each other and form cavities, each cavity having an intended pressure within. The intended pressure is based on the type of MEMS device that will operate within the cavity operating environment.

The second layer 110 may be bonded to the intermediate layer 106 through a variety of methods. In one example, fusion bonding is used to bond the second layer 110 to the intermediate layer 106. The intermediate layer 106 includes a number of through-holes 112 to connect the corresponding recesses and form the full cavities. Specifically, the first recess 104-1 of the first layer 102 and the first recess 108-1 of the second layer 110 connect through the through-holes to form the first operating environment 114-1. Likewise, the second partial cavity 104-2 of the first layer 102 and the second recess 108-2 of the second layer 110 connect through the through-holes to form the second operating environment 114-2. As will be described in further detail below, the bonding processes used to connect the first layer 102 and the second layer 110 to the intermediate layer 106 can be such that the operating environments are hermetically sealed.

The MEMS devices are formed within the operating environments. As mentioned above, these MEMS devices are often designed to operate in different environments. For example, the pressure within the operating environment for one MEMS device may be different than the pressure within the operating environment of another MEMS device. Through principles described herein, these varying operating environments can be formed on the same chip in a one-time process. By forming the varied pressure operating environments in the same process, time and costs for production can be reduced. According to certain illustrative examples, the varied pressure between the operating environments is achieved by varying the characteristics of the recesses used to form the operating environments.

Figure 2A:
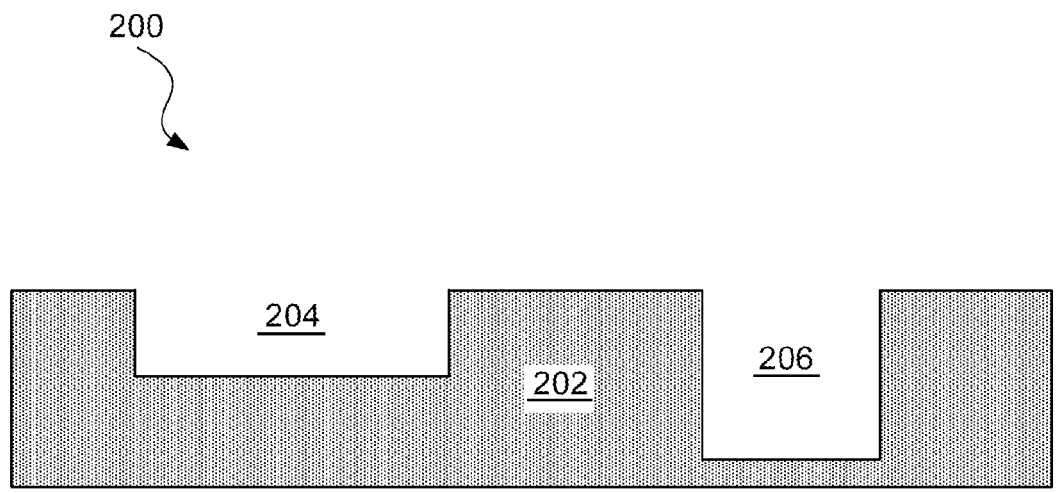
FIG. 2A is a diagram showing varied pressure operating environments, according to one example of principles described herein.

FIG. 2A is a diagram 200 showing illustrative recesses in a wafer 202, with varying dimensions. According to certain illustrative examples, different pressured operating environments can be formed by varying the dimensions of the recesses of either the first layer or the second layer. For example, the depth of one of the recesses may be greater than the depth of other recesses. Additionally or alternatively, the width of one of the recesses may be greater than the width of other recesses.

The wafer 202 illustrated in FIG. 2A may correspond to the first layer 102 or the second layer 110 illustrated in FIG. 1. In this example, a first recess 204 is greater in width than a second recess 206. Additionally, the second recess 206 is deeper than the first recess. Thus, when combined with the corresponding recesses of the other layer, a bonding process is performed to seal the cavities.

Typically, the bonding process is performed at temperature much higher than the operating temperature of the MEMS device. For example, a metal bonding process is typically performed at a temperature ranging between about 400° C. and 450° C. The operating environments of the MEMS devices, however, are usually at room temperature. During the high temperature bonding process, the surface of the cavities may get heated and outgas or release some species. The outgassing or releasing of species can still take place for a while after the cavities are sealed and temperature is dropping. The outgassing or releasing of species may change the pressure within the sealed cavities. Therefore two final operating environments with different pressures will be formed even though they are both processed by the same bonding process. Because the amount of outgassing is in proportion to the surface area of the cavities while the pressure change is dominated by the volume of the cavities, a well-designed difference of size in the cavities can create different final operating environments with different pressures specifically for different MEMS devices placed within.

Figure 2B:
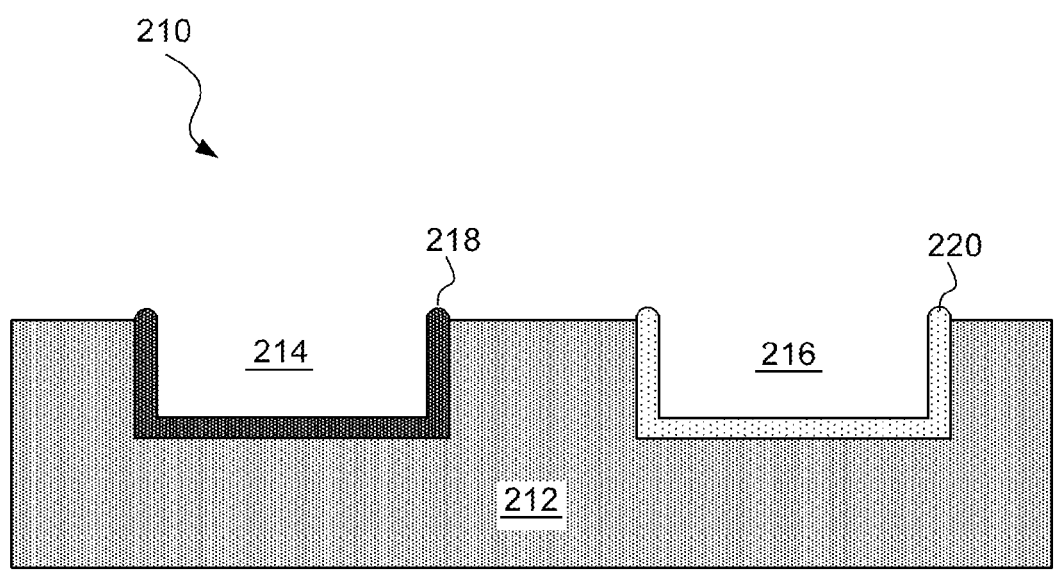
FIG. 2B is a diagram showing varied pressure operating environments, according to one example of principles described herein.

FIG. 2B is a diagram 210 showing illustrative recesses in a wafer 212, with different materials deposited thereon. According to certain illustrative examples, different cavities may have different materials deposited thereon in order to vary the pressure. The nature of the materials deposited within the cavities may absorb gases form the atmosphere thus to create a final operating environment with pressure or degree of vacuum different from the pressure or degree of vacuum during the bonding processes that seal the full cavities. Different materials can create different variances between the pressure during bonding and the pressure of the final operating environment. This creates final operating environments with different pressures or degrees of vacuum in cavities coated with different materials.

The wafer 212 illustrated in FIG. 2B may correspond to either the first layer 102 or the second layer 110 illustrated in FIG. 1. In this example, a first material 218 is deposited into the first recess 214. Additionally, a second material 220 is deposited into the second recess 216. The different materials may be, for example, Aluminum Oxide (AlOx), Aluminum Silicon Nitride (AlSiN), Titanium Nitride (TiN), Aluminum (Al), Titanium (Ti), Gold (Au), or Silver (Ag).

Figure 3:
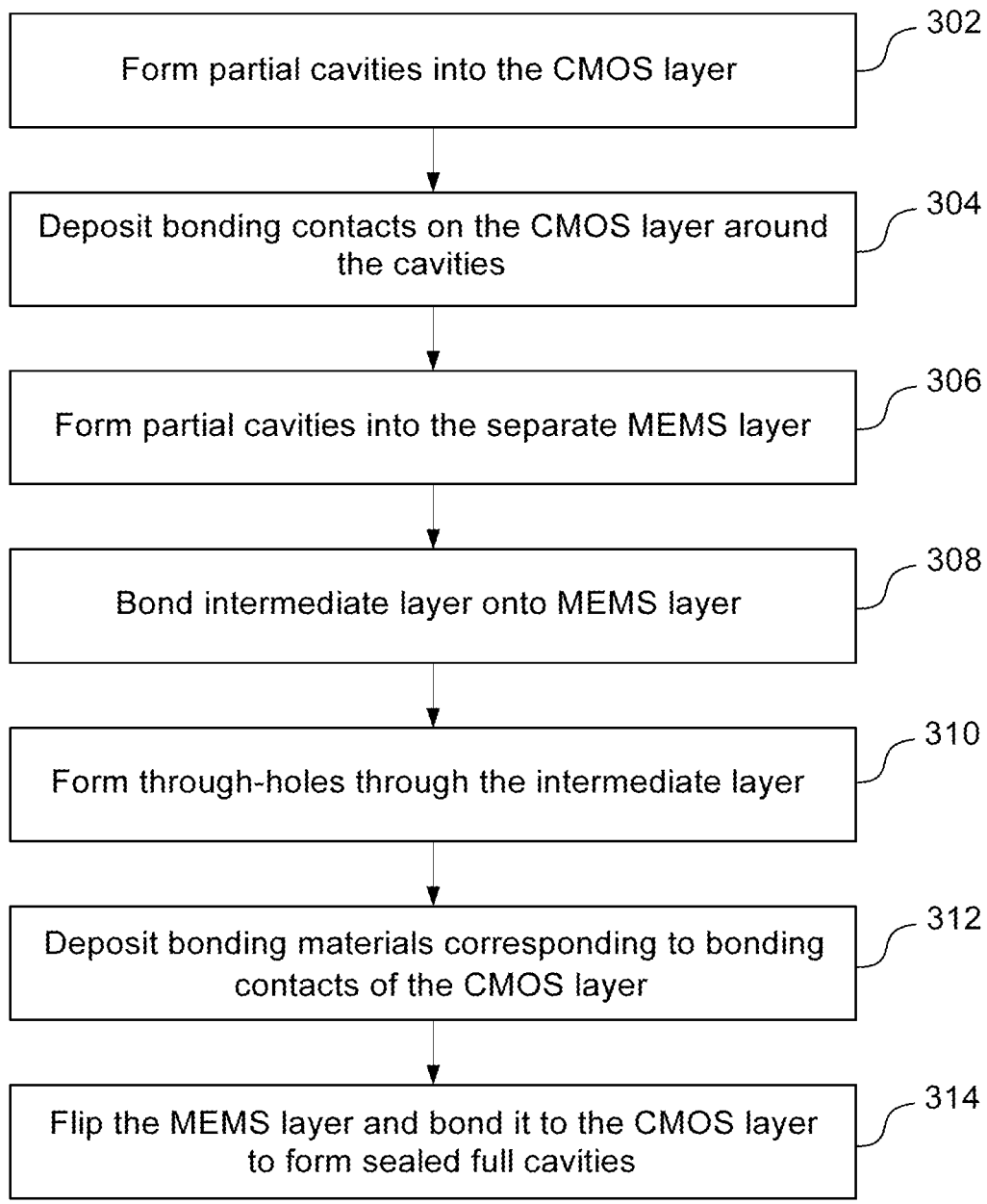
FIG. 3 is a flowchart showing an illustrative process for forming an integrated circuit with pressure varying operating environments between a MEMS layer and a CMOS layer, according to one example of principles described herein.
Figure 4A:
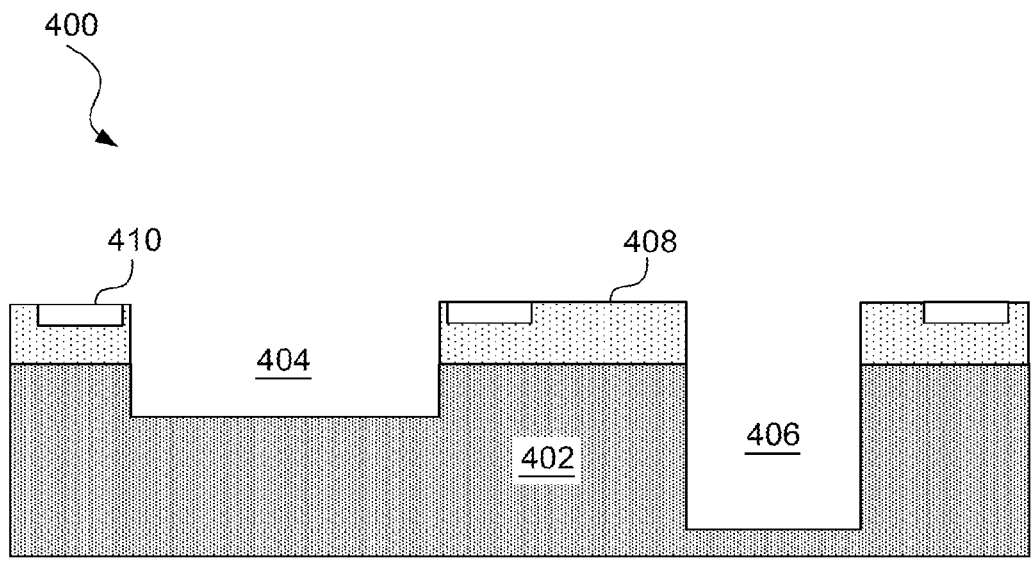
FIG. 4A is a diagram showing an illustrative first layer to be used in forming an integrated circuit with varied pressure operating environments for MEMS devices, according to one example of principles described herein.
Figure 4B:
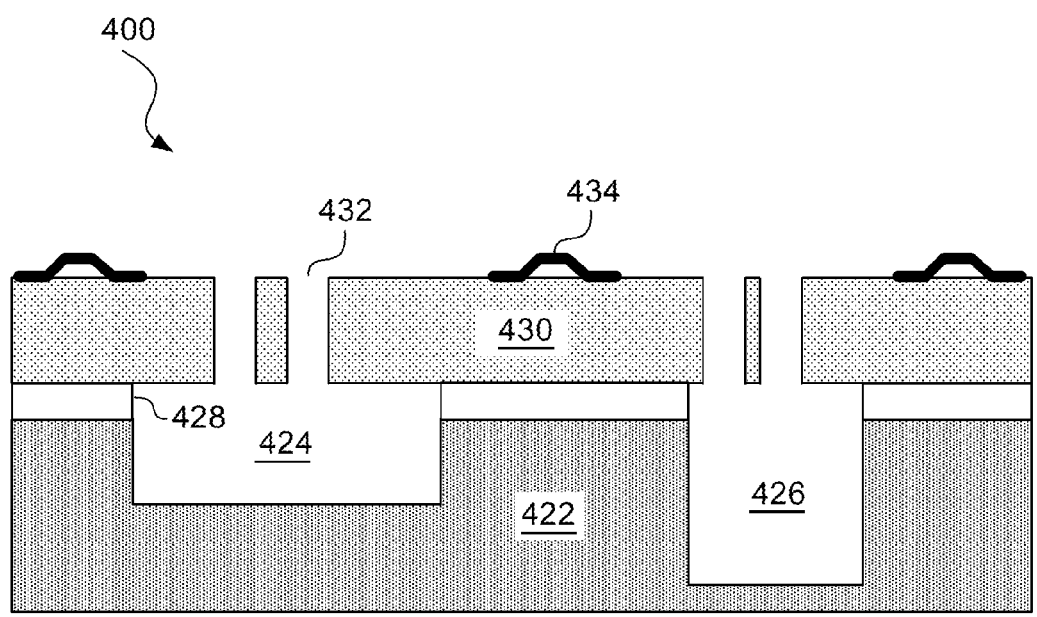
FIG. 4B is a diagram showing an illustrative second layer and intermediate layer to be used in forming an integrated circuit with varied pressure operating environments for MEMS devices, according to one example of principles described herein.
Figure 4C:
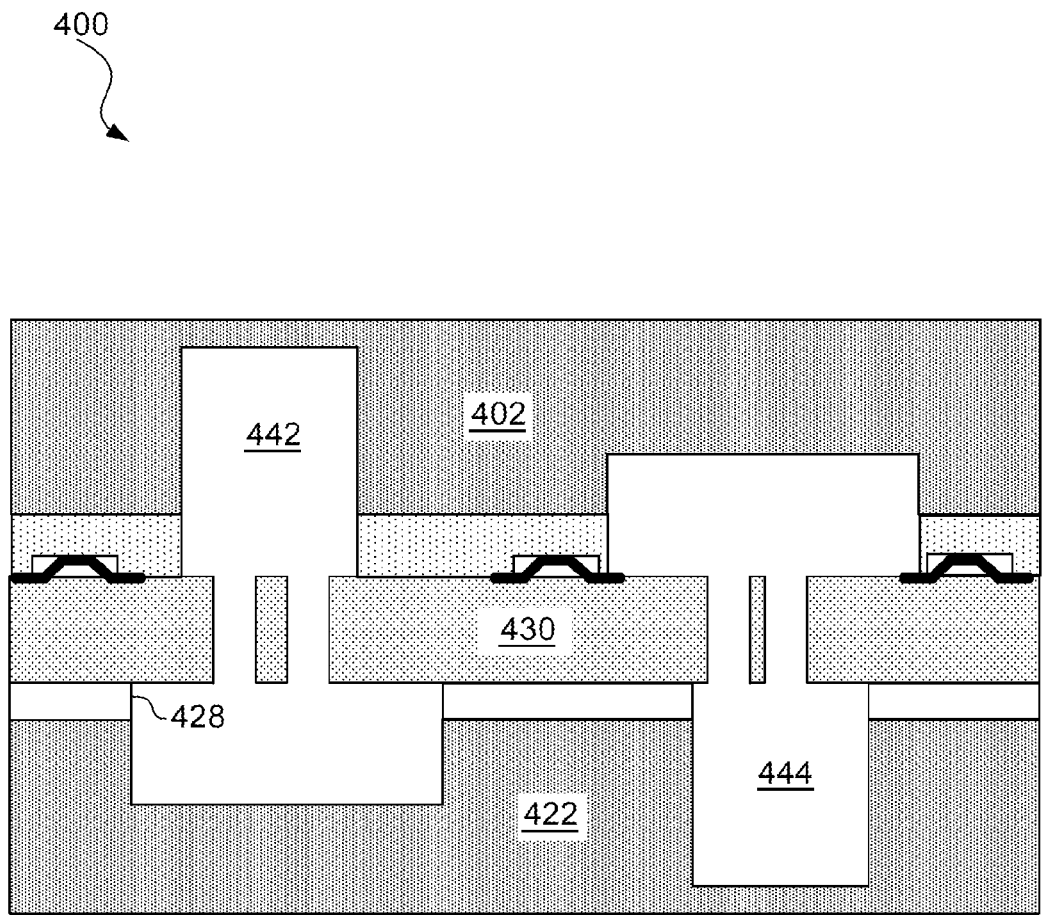
FIG. 4C is a diagram showing an illustrative combination of the first layer and the second layer, according to one example of principles described herein.

FIG. 3 is a flowchart showing an illustrative process 300 for forming an integrated circuit (IC) device within operating environments with varied pressures. The process 300 will be described in concordance with various partial views of an example IC device 400, as shown in FIGS. 4A, 4B, and 4C. The process 300 describes and illustrates a process for forming varied pressure operating environments resulting from cavities with different dimensions. Nevertheless, the principles of the following discussion can also be applied to varied pressure operating environments resulting from various materials deposited within the recesses.

Execution begins at step 302, in which recesses are formed into the first layer of a substrate. FIG. 4A shows an example first layer 402 to be used in forming a IC device with pressure varying operating environments. In this embodiment, the first layer 402 may be referred to as the CMOS layer because the first layer includes standard CMOS circuitry. In one example, the CMOS layer 402 may be made from a Silicon-on-Insulator (SOI) wafer. Two recesses 404, 406 are fabricated so as to have different dimension in widths or depths. Specifically, the second recess 406 is deeper than the first recess 404. Additionally, the two recesses are fabricated so as to have different widths. Specifically, the first recess 404 is wider than the second recess 406. Etching cavities with different widths and depths may be done through a variety of methods as appreciated by those skilled in the relevant art, including patterning/etching one recess, then separately patterning/etching the other recess.

Execution of the method 300 proceeds to step 304 bonding contacts on the CMOS layer around the recesses. Continuing with the example of FIG. 4A, bonding contacts 410 on the CMOS layer 402 around the recesses 404, 406. In some embodiments, the CMOS layer 402 includes an insulator layer 408 deposited on top of the semiconductor material. The insulator layer 408 electrically isolates the metallic bonding contacts 410 from other metallic lines or contacts. The metallic bonding contacts 410 are then formed at the appropriate places around the recesses.

The metallic bonding contacts 410 are designed to facilitate eutectic bonding. Eutectic bonding is a process whereby different materials, at least one of the materials being a metal, are bonded together into a eutectic alloy. Eutectic bonding is often used to bond various components to silicon wafers. Eutectic bonding allows for the formation of hermetically sealed cavities and thus is useful when forming sealed operating environments. Some examples of eutectic bonding that are widely used for MEMS device package are: Al—Si, Au—Sn, Al—Ge, Au—Ge, Au—In and Cu—Sn.

Execution of the method 300 proceeds to step 306 for forming recesses into a second layer. The second layer may be referred to as the MEMS layer because it includes standard MEMS device components. FIG. 4B shows an example second layer 422 to be used in forming the IC device 400 with pressure varying operating environments. Like with the CMOS layer 402 of FIG. 4A, the recesses 424, 426 of the MEMS layer 422 may be of different dimensions. In this example, the second recess 426 is deeper than the first recess 424. Additionally, the first recess 424 is wider than the second recess 426.

Execution of the method 300 proceeds to step 308 for bonding an intermediate layer onto the second layer. Continuing with the example of FIG. 4B, an intermediate layer 430 is bonded onto the MEMS layer 422. The intermediate layer 430 may be a semiconductor wafer used for supporting components of the MEMS devices to be used within the operating environments. Before the intermediate layer 430 is bonded to the MEMS layer 422, an oxide material 428 may be placed on top of the MEMS layer 422. This oxide layer may then be smoothed out using precision grinding techniques. This facilitates fusion bonding which is a standard process for bonding one wafer to another.

Execution of the method 300 proceeds to step 310 for forming through-holes through the intermediate layer. In the example of FIG. 4B, through-holes 432 are formed through the intermediate layer 430. These through-holes 432 can be used to provide a link between the two sets of recesses, thus forming full cavities when the CMOS layer 402 is bonded to the MEMS layer 422. The through-holes 432 may also be used to support various MEMS device components that are placed within the cavities.

Execution of the method 300 proceeds to step 312 for providing bonding materials on the intermediate layer. In the example of FIG. 4B, bonding materials 434 are deposited onto the intermediate layer 430. The bonding materials 434 are placed such that they correspond to the bonding contacts 410 placed on the CMOS layer 402. The bonding materials 434 may be a eutectic alloy to facilitate the eutectic bonding between the intermediate layer 430 and the CMOS layer 402.

Execution of the method 300 proceeds to step 314 in which the second layer is bonded to the first layer to form the fully sealed cavities. Referring to FIG. 4C, in continuation with the present example, the MEMS layer 422 of FIG. 4B is flipped over and bonded to the CMOS layer 402 of FIG. 4A to form fully sealed cavities of the IC device 400. As illustrated in FIG. 4C, the bonding contacts 410 and the bonding materials 434 are connected to form the hermetically sealed full cavities 442, 444. During the bonding process, the different sized cavities will lead to different pressures within the different operating environments.

In some examples, the different sized recesses of either the CMOS layer 402 or the MEMS layer 422 may have a layer of additional materials deposited thereon. These additional materials may be specifically designed to affect the atmospheric pressure within final operating environments. In some cases, recesses with similar dimensions can be made to have different pressures through use of different materials being deposited into those cavities.

Figure 5:
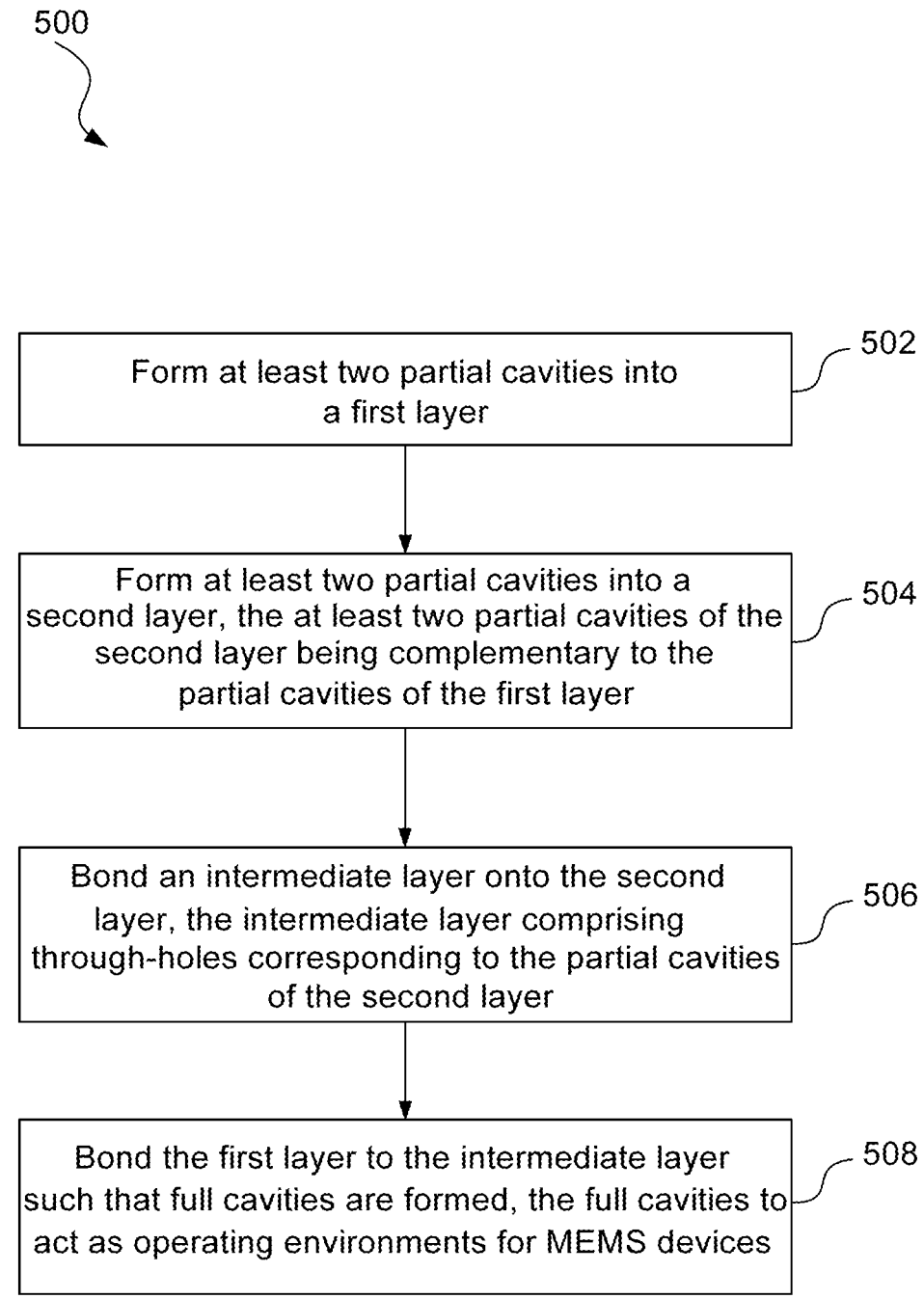
FIG. 5 is a flowchart showing an illustrative method for forming an integrated circuit having varied pressure operating environments for MEMS devices, according to one example of principles described herein.

FIG. 5 is a flowchart showing another embodiment of a method 500 for forming an integrated circuit having varying pressure operating environments for MEMS. Execution of the method 500 begins at step 502 for forming at least two recesses into a first layer. This step is similar to step 302 discussed above, with reference to FIG. 3.

Execution of the method 500 proceeds to step 504 for forming at least two recesses into a second layer, the at least two recesses of the second layer being complementary to the recesses of the first layer. This step is similar to step 306 discussed above, with reference to FIG. 3.

Execution of the method 500 proceeds to step 506 for bonding an intermediate layer onto the second layer, the intermediate layer comprising through-holes corresponding to the recesses of the second layer. Execution then proceeds to step 508 for bonding the first layer to the intermediate layer such that cavities are formed, the cavities to act as operating environments for MEMS devices, wherein the two cavities have different pressures.

According to certain illustrative examples, an integrated circuit device includes a first layer comprising at least two recesses. The device also includes an intermediate layer bonded to the first layer, the intermediate layer comprising at least two through holes substantially aligned to the at least two recesses cavities of the first layer. The device also includes a second layer bonded to the intermediate layer, the second layer comprising at least two recesses substantially aligned to at least two through holes to form at least two sealed cavities comprising the at least two recesses of the first layer and the at least two recesses of the second layer. The at least two cavities have different pressures within.

According to certain illustrative examples, a method for forming an integrated circuit having Micro-electromechanical Systems (MEMS) includes forming at least two recesses into a first layer, forming at least two recesses into a second layer, the at least two recesses of the second layer being complementary to the recesses of the first layer, bonding an intermediate layer onto the second layer, the intermediate layer comprising through-holes corresponding to the recesses of the second layer, and bonding the first layer to the intermediate layer such that cavities are formed, the cavities to act as operating environments for MEMS devices. The two cavities have different pressures.

An integrated circuit device includes a MEMS layer comprising a plurality of recesses. The device also includes an intermediate layer bonded to the MEMS layer, the intermediate layer comprising a plurality of through holes substantially aligned to the plurality of recesses of the MEMS layer. The device also includes a CMOS layer bonded to the intermediate layer, the CMOS layer comprising a plurality of recesses substantially aligned to a plurality of through holes to form a plurality of sealed cavities comprising the plurality of recesses of the MEMS layer and the plurality of recesses of the CMOS layer. The plurality of cavities has different pressures within.

It is understood that various different combinations of the above-listed embodiments and steps can be used in various sequences or in parallel, and there is no particular step that is critical or required. Additionally, although the term "electrode" is used herein, it will be recognized that the term includes the concept of an "electrode contact." Furthermore, features illustrated and discussed above with respect to some embodiments can be combined with features illustrated and discussed above with respect to other embodiments. Accordingly, all such modifications are intended to be included within the scope of this invention.

The foregoing has outlined features of several embodiments. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit device comprising:
   a first layer comprising at least two recesses;
   an intermediate layer bonded to the first layer, the intermediate layer comprising at least two through holes substantially aligned to the at least two recesses of the first layer; and
   a second layer bonded to the intermediate layer, the second layer comprising at least two recesses substantially aligned to at least two through holes to form at least two cavities defined by the at least two recesses of the first layer and the at least two recesses of the second layer;
   wherein the at least two cavities have different pressures therewithin due to a metal containing material formed on a sidewall of a first cavity of the at least two cavities.

2. The device of claim 1, wherein the different pressures between the at least two cavities are also due to variations in size of at least one of the recesses.

3. The device of claim 2, wherein a different sized recess varies in width or length from other recesses.

4. The device of claim 2, wherein a different sized recess varies in depth from other recesses.

5. The device of claim 1, wherein the different pressures between the at least two cavities are due to variations in composition of metal containing materials deposited in a first cavity and a second cavity of the at least two cavities.

6. The device of claim 1, wherein the deposited metal containing material comprises at least one of: Al, Ti, AlOx, AlSiN, TiN, Au and Ag.

7. The device of claim 1, wherein the first layer comprises a complementary metal oxide semiconductor layer.

8. The device of claim 1, wherein the second layer comprises components related to a MEMS device.

9. The device of claim 8, wherein the MEMS device comprises one of: a gyroscope, an accelerometer, a pressure sensor, a motion detector, and RF resonator.

10. The device of claim 1, further comprising:
    a second metal containing material disposed on a sidewall of a second cavity of the at least two cavities, wherein the second metal containing material includes a different metal than the metal containing material disposed on the sidewall of the first cavity.

11. An integrated circuit device comprising:
    a MEMS layer comprising a plurality of recesses;
    an intermediate layer bonded to the MEMS layer, the intermediate layer comprising a plurality of through holes substantially aligned to the plurality of recesses of the MEMS layer; and
    a CMOS layer bonded to the intermediate layer, the CMOS layer comprising a plurality of recesses substantially aligned to a plurality of through holes to form a plurality of cavities comprising the plurality of recesses of the MEMS layer and the plurality of recesses of the CMOS layer;
    wherein the plurality of cavities have different pressures within, wherein the different pressures are a result of a variation in composition of materials disposed within a first and a second recess of the plurality of recesses.

12. The device of claim 11, wherein the variation in different pressures are a result of variation in sizes of the plurality of recesses.

13. The device of claim 11, wherein each of the cavities are fabricated within a same process.

14. An integrated circuit comprising:
    at least two recesses in a first layer;
    at least two recesses in a second layer, the at least two recesses of the second layer being complementary to the recesses of the first layer; and
    an intermediate layer bonded to the first and second layers, the intermediate layer comprising through-holes corresponding to the recesses of the second layer, and the intermediate layer forming cavities with the first layer to act as operating environments for MEMS devices, wherein the two cavities have different pressures; and
    wherein a metal containing material is disposed in at least one of the recesses to cause the different pressures.

15. The device of claim 14 wherein a metal of the metal containing deposited material comprises at least one of: Al, Ti, AlOx, AlSiN, TiN, Au and Ag.

16. The device of claim 14, wherein at least one recess is of a different size to also contribute to the different pressures.

17. The device of claim 16, wherein a different sized recess varies in width or length from other recesses.

18. The device of claim 16, wherein a different sized recess varies in depth from other recesses.

19. The device of claim 14, wherein the MEMS devices comprise one of: a gyroscope, an accelerometer, a pressure sensor, a motion detector, and an RF resonator.

* * * * *